United States Patent
Mälhammar et al.

[11] Patent Number: 5,966,957
[45] Date of Patent: Oct. 19, 1999

[54] COOLING SYSTEM FOR ELECTRONICS

[75] Inventors: Åke Mälhammar, Stockholm; Björn Palm, Huddinge, both of Sweden

[73] Assignee: Telefonaktiebolaget LM Ericsson, Stockholm, Sweden

[21] Appl. No.: 08/913,444
[22] PCT Filed: Mar. 8, 1996
[86] PCT No.: PCT/SE96/00307
§ 371 Date: Dec. 16, 1997
§ 102(e) Date: Dec. 16, 1997
[87] PCT Pub. No.: WO96/29553
PCT Pub. Date: Sep. 26, 1996

[30] Foreign Application Priority Data

Mar. 17, 1995 [SE] Sweden .................................. 9500944

[51] Int. Cl.⁶ .......................... F25B 23/00; F28D 15/02; H01L 27/427; H01F 27/18
[52] U.S. Cl. ................................... 62/259.2; 165/104.22; 165/104.33
[58] Field of Search ..................... 62/259.2, 119; 165/104.11, 104.21, 104.22, 104.29, 104.33; 361/687, 700, 689, 699

[56] References Cited

U.S. PATENT DOCUMENTS

| | | | |
|---|---|---|---|
| 3,609,991 | 10/1971 | Chu et al. | 62/333 |
| 4,502,286 | 3/1985 | Okada et al. | 62/119 |
| 4,611,654 | 9/1986 | Buchsel | 165/104.22 |
| 5,203,399 | 4/1993 | Koizumi | 165/104.33 |

FOREIGN PATENT DOCUMENTS

| | | |
|---|---|---|
| 0245848A1 | 11/1987 | European Pat. Off. |
| 3422039 | 12/1985 | Germany. |
| 2173413 | 10/1986 | United Kingdom. |

OTHER PUBLICATIONS

International Search Report corresponding to International Application No. PCT/SE96/00307, mailed Jul. 4, 1996.

*Primary Examiner*—William Doerrler
*Attorney, Agent, or Firm*—Burns, Doane, Swecker & Mathis, L.L.P.

[57] ABSTRACT

A cooling system, especially for electronic components, having a hermetically closed pipe conduit including an evaporator and a condenser, and utilizing thermosiphon circulation of the refrigerant used in the pipe conduit. The evaporator is in heat conducting contact with a heat emitting component to be cooled and absorbs heat therefrom. The heat is transported through the pipe conduit by the refrigerant to the condenser and dissipated therein. The pipe conduit includes a plurality of evaporators in series, each being in heat conducting contact with a heat emitting component, and the condenser is placed so that the liquid level of the condensed refrigerant is below the upper-most situated evaporator in the pipe conduit. This is rendered possible by the increased pumping action achieved by the evaporators connected together in series in the circulation direction after the evaporators partly evaporated refrigerant used in the pipe conduit.

10 Claims, 2 Drawing Sheets

COOLING SYSTEM FOR ELECTRONICS

TECHNICAL FIELD

The present invention relates to a cooling system, and then more particularly to a system for cooling electronic components which utilizes a thermosiphon effect to circulate the refrigerant used in the system. The system comprises an hermetically closed pipe circuit which includes an evaporator and a condenser, wherein the evaporator is in heat-conducting contact with a heat-emitting component to be cooled and absorbs heat therefrom, this heat being transported by the refrigerant through the pipe circuit and to the condenser and dissipated therein.

DESCRIPTION OF THE PRIOR ART

In principle a thermosiphon circuit is comprised of an evaporator and a condenser which are incorporated in a pipe circuit. The circuit is hermetical and is filled with a coolant or refrigerant suitable for the purpose intended. In order for the circuit to function, it is necessary for the condenser to be located somewhat above the evaporator. When heat is delivered to the evaporator, part of the coolant will boil off and a mixture of liquid and gas rises up to the condenser. The coolant condenses in the condenser and heat is released. The liquid thus formed then runs back to the evaporator under its own weight.

Thermosiphon circuits are normally very efficient heat transporters, insomuch as heat can be transported through long distances at low temperature losses. They can therefore be used advantageously for different cooling purposes. Furthermore, there is generally a great deal of freedom in the design of the evaporator and condenser. In the context of electronic component cooling, however, the components to be cooled are normally very small, which means that the evaporator must also be small. The external cooling medium used is normally air, which in turn means that the condenser must have a large external surface area. In these contexts, it can therefore be said that a thermosiphon circuit is an apparatus with whose aid very large surface enlargements can be obtained and that these surface enlargements can furthermore be placed at a long distance from the heat source.

One of the drawbacks with thermosiphon circuits is that the condenser must always be placed higher than the evaporator. In present-day electronic systems comprising a large number of densely packed components of which several need to be cooled, cooling is difficult to achieve because each of these heat-emitting components requires its own evaporator with associated condenser. Difficulties are encountered in laying out the pipes that form the pipe circuits and also in suitable positioning of the condensers.

SUMMARY OF THE INVENTION

The object of the present invention is to avoid the drawbacks of existing thermosiphon circuits, by providing a cooling system which does not require complicated pipe lay-outs, and with which positioning of the condenser is not restricted to the same extent as in earlier known systems of this kind. This object is achieved with a cooling system having the characteristic features set forth in the following Claims.

The invention is based on the concept that when more than one evaporator is used, the evaporators can be connected in series to provide a pumping action which will enable one or more evaporators to be situated above the condenser liquid level. This greatly increases the degree of freedom in condenser placement. In an electronic component cooling context, it may also be assumed that a number of components located at mutually different heights will normally require some form of additional cooling. In some cases, the liquid that is entrained with the gas that boils-off in the evaporators is able to improve the function, whereas in other cases the liquid can present a problem. However, the liquid content of this two-phase mixture can be regulated to a great extent with an evaporator construction of suitable design.

The invention will now be described in more detail with reference to a preferred embodiment thereof and also with reference to the accompanying drawings.

DETAILED DESCRIPTION OF A PREFERRED EMBODIMENT

Figure 1:
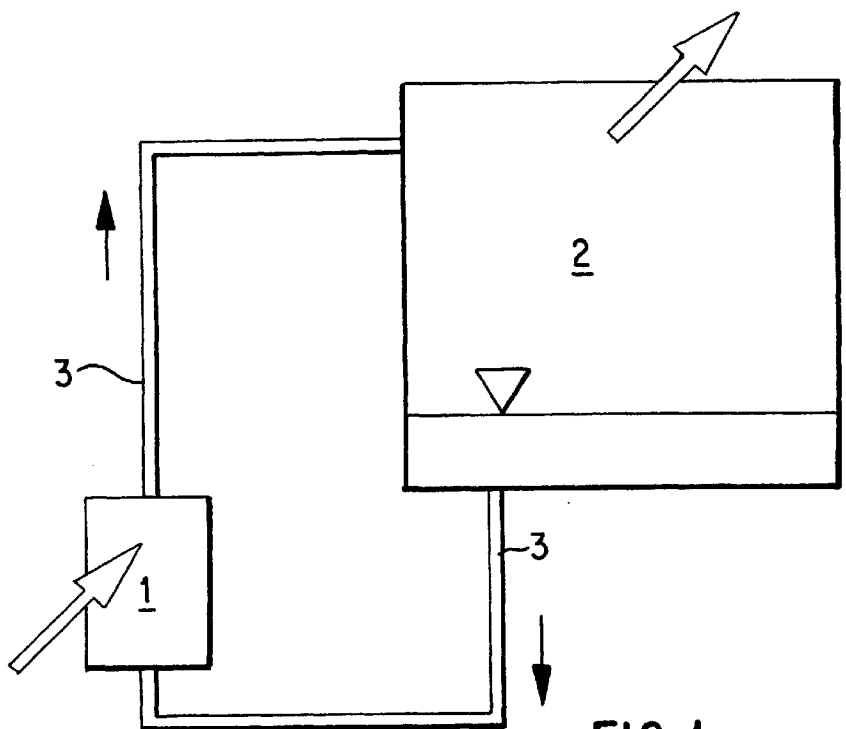
FIG. 1 is a diagrammatic illustration of the principles of a known thermosiphon circuit.

FIG. 1 illustrates schematically the principles of a known thermosiphon circuit comprising an evaporator 1 and a condenser 2 which are connected in a pipe circuit 3. The circuit is hermetical and is filled with a cooling medium suitable for the purpose intended. When heat is delivered to the evaporator 1, part of the medium will boil off and a mixture of liquid and gas rises up in the pipe circuit 3, towards the condenser 2. The medium is condensed in the condenser 2 and heat is released. The liquid thus formed then runs back to the evaporator, under its own weight. The transfer of heat is shown schematically by the heavy arrows in FIG. 1, while refrigerant circulation is shown by the smaller arrows. In order for the circuit to function, it is necessary for the condenser liquid level to be slightly higher than the evaporator.

Figure 2:
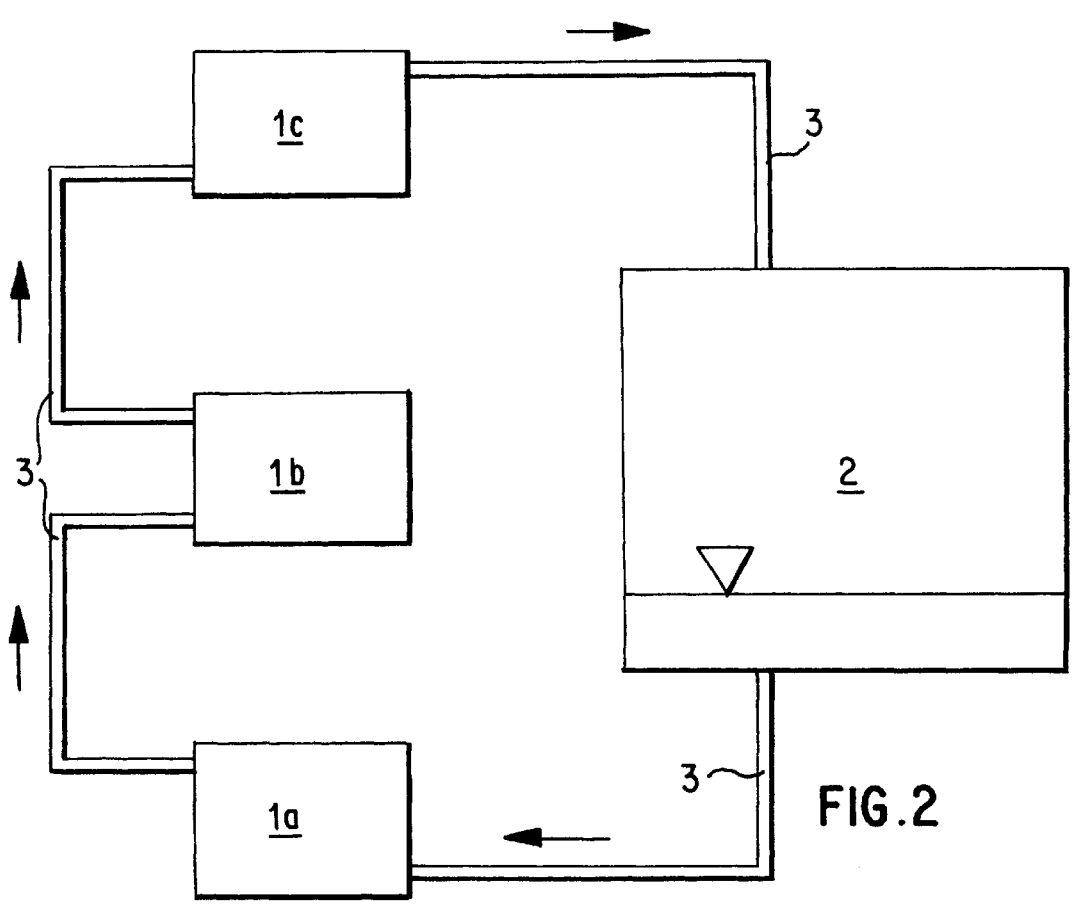
FIG. 2 is a diagrammatic illustration of the principles of an inventive thermosiphon circuit.

FIG. 2 illustrates diagrammatically the principles of an inventive thermosiphon system. By connecting a plurality of evaporators 1a, 1b and so on in series in the pipe circuit 3, pumping of the refrigerant used in the pipe circuit can be elevated, while the condenser 2 can be positioned so that the level of the condensed liquid refrigerant therein lies beneath the highest evaporator 1c in the pipe circuit, as evident from the Figure. The reason for this is because the intrinsic weight, or dead weight, of the liquid leaving the condenser 2 is much greater than the intrinsic weight, or dead weight, of the two-phase mixture leaving the bottom evaporator 1a. The two-phase mixture is therewith driven upwards and the liquid entrained therewith can be used to evaporate the liquid in the upper evaporators 1b, and so on. This pump principle is known in the literature under the designation airlift pump.

Figure 3:
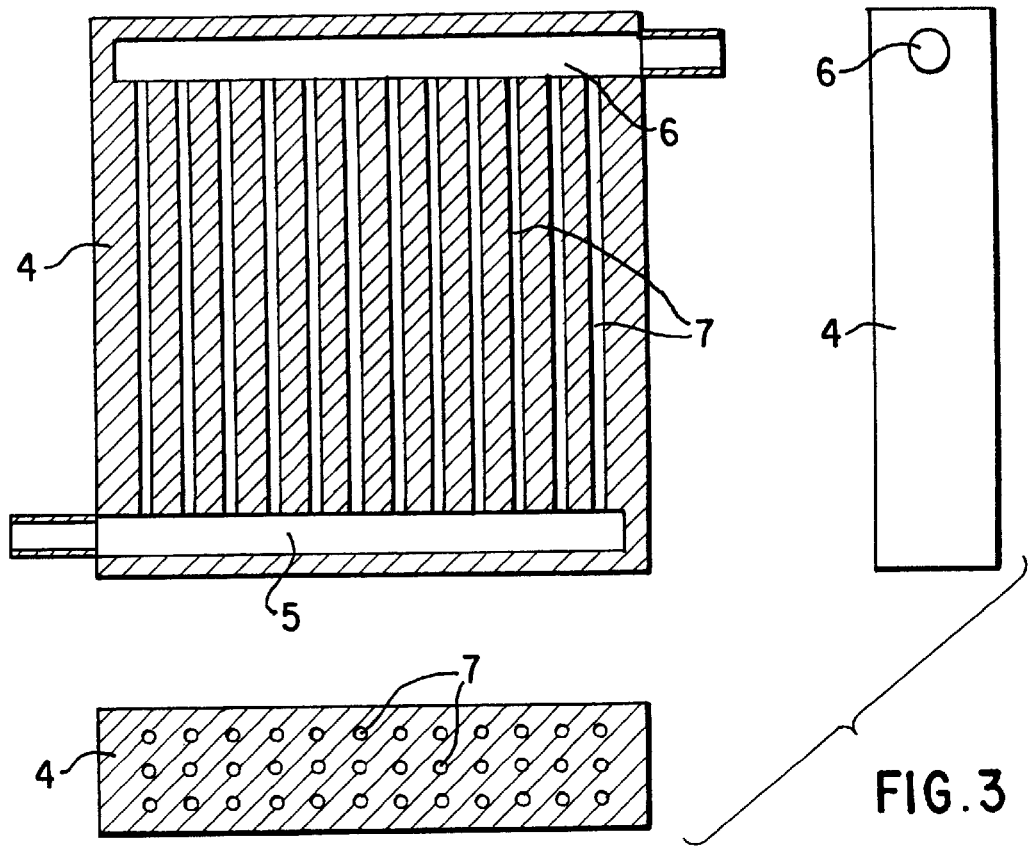
FIG. 3 is a side view of an evaporator used in an inventive thermosiphon circuit and also presents two different sectional views of the evaporator.

In this context, the function is improved by the liquid that is entrained with the gas that boil off in the evaporators. The liquid content of the two-phase mixture can be regulated to a great extent by suitable choice of drive height, pipe diameters and evaporator design. Practical tests have shown that one heat transfer improvement factor is a combination of high pressure and narrow passageways. Heat transfer numbers have been measured which have a factor 5–10 times higher than what is normal in other contexts in which boiling media are used FIG. 3 illustrates the construction of an evaporator 1. A metal body 4 includes an inlet chamber 5 and an outlet chamber 6 which are mutually connected by a large number of narrow passageways 7 having a diameter of millimeter size. The construction can be made so that the total mantle surface of these passageways is much greater than the front surface of the metal body. Heat transfer can be greatly improved in this way, in certain cases.

An inventive cooling system finds particular use in connection with so-called multichip modules. A multichip module can be said generally to comprise a capsule which contains more than one microcircuit. In modern electronics, these modules often have the form of a small circuit board with dimensions that can vary from the size of a postage stamp to the size of the palm of a hand. One of the advantages afforded by multichip modules is that the microcircuits can be placed close together and therewith enable high signal speeds to be used. One of the drawbacks with multichip modules is that the cooling problem is difficult to overcome.

A multichip module will often have a very large number of electrical connections and must therefore be attached parallel with the circuit board on which the module is used. As a result, only one side of the multichip module can be used for cooling with air, which presents a serious problem. When cooling is effected from the carrier side, this side must be a good conductor of heat and the microcircuits must also be effectively coupled thermally to the carrier. When cooling is effected from the microcircuit side, their component carrying surfaces must face downwards and the cooling body must also be adapted for connection to circuits at different heights, at least in the majority of cases in practice. Problems which greatly restrict freedom of construction thus occur in both cases.

Figure 4:
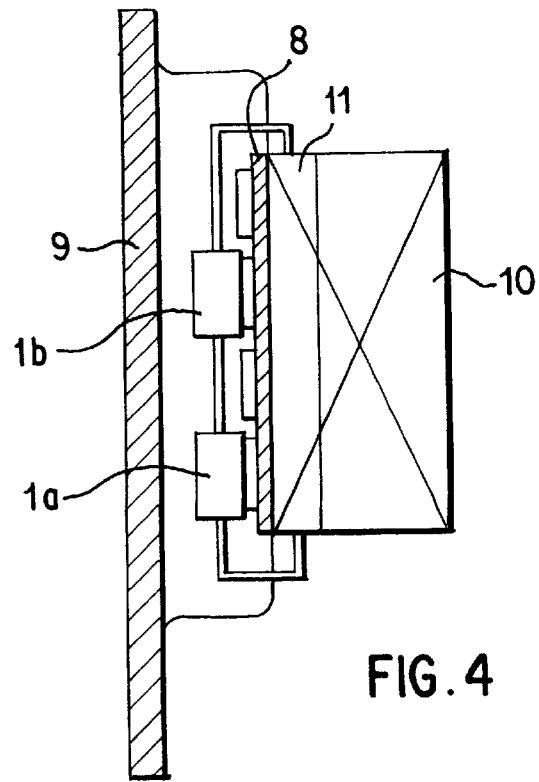
FIG. 4 illustrates an embodiment of the use of an inventive thermosiphon circuit in a so-called multichip module.

It is therefore obvious that two-sided cooling, which can be achieved with an inventive thermosiphon circuit, would provide significant advantages. The principle is illustrated in FIG. 4. A multichip module 8 is affixed parallel with a circuit board 9. Located on the carrier side of the multichip module 8 is a fin cooler 10 with a condenser 2 integrated in the bottom plate 11. The condenser is suitably comprised of a plurality of vertical passageways or channels having a cross-sectional area optimal for the purpose concerned. The evaporators la and lb of the thermosiphon circuit are situated on the microcircuit side of the module 8 and mounted on those microcircuits that have the highest power losses. The cooling system operates in the same manner as that described above with reference to FIG. 2.

It is fully possible to drive the circulation in a thermosiphon circuit with solely some centimeters difference in height between the level of liquid in the condenser and the lowermost evaporator. Liquid can be delivered to the remaining evaporators through the pumping action achieved with the series connection described above. The level of liquid in the condenser can therefore be kept low, which results in effective use of the condenser surfaces.

It will be understood that the invention is not restricted to the aforedescribed and illustrated embodiment thereof, and that modifications can be made within the scope of the following Claims.

We claim:

1. A cooling system for cooling electronic components, comprising
a hermetically closed pipe circuit which includes an evaporator and a condenser and in which a refrigerant used in the circuit is circulated by a thermosiphon effect, the evaporator being in heat-conducting contact with a plurality of heat-emitting components of a multichip module to be cooled and absorbs heat therefrom, the absorbed heat being transported through the pipe circuit by the refrigerant to the condenser and dissipated therein, the pipe circuit including a plurality of series-connected evaporators each being in heat-conducting contact with one of said heat-emitting components, each of the evaporators including a heat-conducting body having a plurality of narrow and mutually parallel passageways between a respective inlet chamber and outlet chamber formed in said conducting body and connected to the pipe circuit, said evaporators being disposed on the heat-emitting components of the multichip module and inside said multichip module, the evaporators together enhancing pumping of the refrigerant used in the pipe circuit, the condenser being located outside the multichip module and on a carrier side of the multichip module so that the liquid level of the condensed refrigerant is below an uppermost evaporator in the pipe circuit.

2. A cooling system according to claim 1, wherein the condenser includes cooling fins that extend outwardly from the module.

3. A cooling system according to claim 1, wherein the condenser includes a fin cooler having vertical refrigerant passageways.

4. A cooling system for cooling electronic components, comprising:
   at least a first electronic component and a second electronic component; and
   a refrigerant circuit that circulates a refrigerant by a thermosiphon effect during operation of said cooling system, said refrigerant circuit having a condenser, and at least a first evaporator and a second evaporator that are connected in series, said second evaporator being located above said first evaporator and also above a liquid level of refrigerant in said condenser during operation of said cooling system, said first evaporator being in heat-conducting contact with said first electronic component, and said second evaporator being in heat-conducting contact with said second electronic component.

5. The cooling system of claim 4, wherein said first electronic component and said second electronic component are located inside a multichip module, said first evaporator being deposed on said first electronic component and said second evaporator being deposed on said second electronic component.

6. The cooling system of claim 5, wherein said condenser is located outside said multichip module and on a carrier side of said multichip module.

7. The cooling system of claim 6, wherein said first evaporator is at least partially below said liquid level of refrigerant in said condenser during operation of said cooling system.

8. The cooling system of claim 4, wherein said first electronic component and said second electronic component are substantially vertically aligned.

9. The cooling system of claim 4, wherein said condenser includes fins for cooling said refrigerant.

10. A cooling system for cooling electronic components, comprising:
    a first electronic component and a second electronic component;

a first evaporator in heat-conducting contact with said first electronic component; and a second evaporator in heat-conducting contact with said second electronic component, said first evaporator and said second evaporator vertically arranged and being connected in series by a refrigerant circuit having a condenser such that an airlift pump is formed when said cooling system is operated.

* * * * *